(12) United States Patent
Look et al.

(10) Patent No.: US 7,761,837 B2
(45) Date of Patent: Jul. 20, 2010

(54) METHOD OF MAKING ALTERNATING PHASE SHIFT MASKS

(75) Inventors: Lieve Van Look, Leuven (BE); Staf Verhaegen, Putte (BE); Eric Hendrickx, Linden (BE)

(73) Assignee: IMEC, Leuven (BE)

( * ) Notice: Subject to any disclaimer, the term of this patent is extended or adjusted under 35 U.S.C. 154(b) by 713 days.

(21) Appl. No.: 11/543,302

(22) Filed: Oct. 3, 2006

(65) Prior Publication Data

US 2007/0087273 A1 Apr. 19, 2007

(30) Foreign Application Priority Data

Oct. 3, 2005 (EP) ................... 05447222

(51) Int. Cl.
*G06F 17/50* (2006.01)
(52) U.S. Cl. ................ 716/19; 716/20; 716/21
(58) Field of Classification Search ............. 716/19–21; 430/5
See application file for complete search history.

(56) References Cited

U.S. PATENT DOCUMENTS

| 7,120,882 | B2 * | 10/2006 | Kotani et al. ................. 716/5 |
| 7,181,707 | B2 * | 2/2007 | Kotani et al. ................. 716/5 |
| 7,514,183 | B2 * | 4/2009 | Hsu et al. ..................... 430/5 |
| 2002/0042007 | A1 * | 4/2002 | Miyazaki et al. .............. 430/5 |
| 2004/0015794 | A1 * | 1/2004 | Kotani et al. ................. 716/4 |
| 2005/0177811 | A1 * | 8/2005 | Kotani et al. ................ 716/21 |
| 2005/0188341 | A1 * | 8/2005 | Fukuhara et al. ............ 716/19 |
| 2006/0234136 | A1 * | 10/2006 | Kim .............................. 430/5 |
| 2006/0236294 | A1 * | 10/2006 | Saidin et al. ................ 716/19 |
| 2006/0282814 | A1 * | 12/2006 | Percin et al. ................ 716/21 |

OTHER PUBLICATIONS

Drapeau et al. (2005) A practical alternating PSM modeling and OPC approach to deal with 3D mask effects for the 65nm node and beyond. Annual BACUS Symposium on Photomask Technology, Proceedings of SPIE. vol. 5992, 11 pages.

Griesinger et al. (2001) Balancing of alternating phase shifting masks for practical application: modeling and experimental verification. 20th Annual BACUS Symposium on Photomask Technology, Proceedings of SPIE. 4186:372-383.

LaCour et al. (2004) Prediction of design sensitivity to altPSM lithography across process window. 24th Annual BACUS Symposium on Photomask Technology, Proceedings of SPIE. 5567:604-610.

(Continued)

*Primary Examiner*—Stacy A Whitmore
(74) *Attorney, Agent, or Firm*—Knobbe Martens Olson & Bear LLP

(57) ABSTRACT

One inventive aspect relates to a phase shift mask suitable for lithographic processing of a device, to a method of making such a mask and to lithographic processing using such a mask. The phase shift mask is made taking into account the threshold or dose that will be used for lithographic processing using the mask. In this way, image imbalance will be reduced in a significant focus-exposure processing window. In one embodiment, evaluation of the image imbalance is performed taking into account the processing windows for the different edges of the features of the pattern.

9 Claims, 18 Drawing Sheets

OTHER PUBLICATIONS

Look et al. (2005) Image imbalance compensation in alternating phase-shift masks towards the 45nm node through-pitch imaging. 25th Annual BACUS Symposium on Photomask Technology, Proceedings of SPIE. vol. 5992, 12 pages.

Nakazawa et al. (1997) Fabrication of 0.1 μm patterns using an alternating phase shift mask in ArF excimer laser lithography. Jpn. J. Appl. Phys. vol. 36, Part 1, No. 12B, pp. 7488-7493.

Philipsen et al., (2004) Through-pitch characterization and printability for 65nm half-pitch alternating aperture phase shift applications, Proceedings of the Photomask Japan PMJ Conference, 12 pages.

Philipsen et al., Printability of topography in alternating aperture phase-shift masks, 24th Annual BACUS Symposium on Photomask Technology, Proceedings of SPIE, 2004, vol. 5567, p. 587.

\* cited by examiner

METHOD OF MAKING ALTERNATING PHASE SHIFT MASKS

TECHNICAL FIELD OF THE INVENTION

The present invention relates to methods and systems for lithographic processing of a device. More particularly, the present invention relates to lithographic alternating phase shift masks, methods of making them and methods of using lithographic alternating phase shift masks.

DESCRIPTION OF THE RELATED TECHNOLOGY

Lithographic processing is one of the key features in the manufacturing of today's circuits and integrated components. The quality of the lithographic processing is strongly dependent on the lithographic system and the mask used. Different types of lithographic masks are known such as binary masks, like chrome on glass masks and phase shift masks, such as e.g. alternating phase shift masks and attenuated phase shift masks.

The use of alternating phase shift masks (Alternating PSM) is a strong imaging technique combining high contrast and a low mask error enhancement factor (MEEF) with a large focus depth, especially for dense features. Alternating phase shift masks are masks wherein transmitting areas are used having a 180° phase difference with other transmitting areas of the mask. A feature on mask thereby is always surrounded by transmitting regions of different phase. The occurrence of the phase difference leads to destructive interference, resulting in a sharp dark image.

A disadvantage of the use of alternating phase shift masks is the occurrence of image imbalance, which is intrinsically related to alternating phase shift mask imaging, leading to focus-dependent feature shifts. An appropriate compensation for the induced focus-dependent feature shifts, such as e.g. line displacements, is needed in order to fully exploit the advantages of alternating phase shift mask imaging.

In general, two types of feature shift can be distinguished. Feature shift can originate from light scattering in the trenches of the alternating phase shift mask. An alternative source for image imbalance is the occurrence of a phase error, e.g. by a wrong effective phase shift of the light in the trenches. This might be caused by a mask fabrication error but also can be due to an intrinsic 3D effect due to the small feature sizes involved. Even a perfect mask, such as e.g. a simulated mask, can suffer from these intrinsic 3D effects, and thus from this type of image imbalance.

Several image imbalance compensation strategies are known: Some examples of structural changes to the mask for compensating intensity imbalance are shown in FIG. 1a to FIG. 1c. FIG. 1a illustrates a mask 10 with compensation by undercut of the blocking region, indicated by the dashed region, adjacent a π-phase region, i.e. providing some undercut of the light-blocking layer, e.g. chrome layer. FIG. 1b shows a mask 20 with compensation by double trenching whereby a shallow trench is provided at the 0 phase region at the left of the blocking region, indicated by the dashed region. FIG. 1c shows a mask 30 with compensation by trench-space biasing for the π phase region at the right of the blocking region indicated by the dashed region. Providing undercut, using double trenching, using double patterning or applying side-wall chrome alternating aperture mask features may allow reduction of image imbalance caused by scattering. In order to reduce image imbalance caused by phase errors e.g. double exposure may be performed or additional measures can be taken when manufacturing the mask, such as e.g. an etch stop layer may be provided to avoid micro-loading.

Further optimisation for compensation, control and evaluation of intensity imbalance is useful, e.g. in view of the evolution towards high numerical aperture or hyper numerical aperture lithography systems and the associated shrinkage of features sizes and pitches, which puts stronger demands on the placement of the printed features e.g. in order to meet the overlay requirements.

SUMMARY OF CERTAIN INVENTIVE ASPECTS

It is an object of certain inventive aspects to provide improved phase shift masks, methods of manufacturing such improved phase shift masks and methods for using such improved phase shift masks. It is an advantage of embodiments to provide phase shift masks allowing reduction of image imbalance during lithographic processing of a device.

The above objective is accomplished by a method and device according to embodiments.

A first aspect of the present invention relates to a method for making a phase shift mask in or on a substrate, said phase shift mask being suitable for lithographic processing of a device using a predetermined illumination dose. The method comprises etching said substrate according to mask parameters, the etching comprising forming at least one means for generating a phase shift, wherein said mask parameters, comprising at least a size of said means for generating a phase shift, are selected taking into account said illumination dose. Selecting mask parameters may be selecting values for said mask parameters.

A method according to the first aspect, etching said substrate comprises forming a trench in said substrate, wherein said mask parameters comprise at least an etching depth for said trench. In other words, a value for said etching depth, corresponding with the trench depth, may be selected taking into account said illumination dose. Said mask parameters also may comprise a trench bias and a light blocking part bias, e.g. a Chrome width. In other words the light blocking part bias and/or the trench bias may be determined taking into account the illumination dose.

A second aspect of the present invention relates to a method of designing a phase shift mask, said mask comprising at least a means for generating a phase shift, said mask being suitable for lithographic processing of a device using a predetermined illumination dose. The method comprises selecting at least one set of mask parameters, comprising at least a size of said means for generating a phase shift, taking into account said illumination dose.

A method according to the second aspect, wherein said selecting of at least one set of mask of mask parameters comprise selecting a plurality of sets of mask parameters suitable for using said phase shift mask substantially in focus, and selecting from said plurality of sets of mask parameters at least one set of mask parameters suitable for using said phase shift mask with said illumination dose in a predetermined out of focus range.

A method according to any of the foregoing embodiments of the second aspect wherein said mask comprising at least a trench and light blocking parts, said mask parameters comprising at least a trench bias, a light blocking part bias and an etching depth of said trench, said mask being suitable for printing features on a device wherein selecting a plurality of sets of mask parameters suitable for using said phase shift mask substantially in focus comprises adjusting the light blocking part bias to correct a feature size and adjusting the trench bias to correct a feature position. Said trench bias and said light blocking part bias may be optimised for a predetermined range of doses, a predetermined range of etching depths and/or a predetermined range of pitches.

A method according to any of the foregoing embodiments of the second aspect, said mask comprising at least a trench and said mask parameters comprising at least an etching depth of said trench, whereby said selecting at least one set of mask parameters suitable for using said phase shift mask with said illumination dose in a predetermined out of focus range, comprising selecting a set of mask parameters corresponding with a predetermined etching depth.

A method according to any of the foregoing embodiments of the second aspect, said selecting at least one set of mask parameters suitable for using said phase shift mask with said illumination dose in a predetermined out of focus range may comprise determining any of a focus-exposure matrix or an amount of feature displacement for a feature printable using said mask for said plurality of sets of mask parameters, and evaluating said focus exposure matrix or said amount of feature displacement for a feature printable using said mask.

A method according to any of the foregoing embodiments of the second aspect, said method comprising evaluating a focus-exposure window for a feature printable using said mask, wherein said focus-exposure window is determined by a part of focus-exposure windows for at least two edges of said feature printable using said mask. With a common part of the focus-exposure windows for at least two edges of said feature printable using said mask there may be meant that the focus-exposure window used for evaluating is determined by the overlapping part of the focus-exposure windows for the edges of the feature printable using said mask.

A third aspect of the present invention relates to a method for performing lithographic processing of a device, the method comprising using a phase shift mask and using an illumination dose, wherein one of said phase shift mask and said illumination dose are selected as a function of the other.

A method according to the third aspect whereby for a predetermined illumination dose, said phase shift mask is made according to any of the foregoing methods according to the first aspect as described above.

A method according to the third aspect whereby for a predetermined illumination dose said phase shift mask is designed according to any of the foregoing methods according to the second aspect as described above.

A method according to any of the foregoing embodiments of the third aspect, whereby for a predetermined phase shift mask, an illumination dose is selected as function of mask parameters comprising a size of a means for generating a phase shift of said phase shift mask. Said selection may be performed as a function of a depth of a trench in said phase shift mask.

A fourth aspect of the present invention relates to a method for making a phase shift mask in or on a substrate, said phase shift mask suitable for lithographic processing of a device using a predetermined illumination dose, the method comprising etching said substrate according to mask parameters, the etching comprising forming at least one phase shifting structure, wherein said mask parameters, comprising at least a size of said phase shifting structure, are selected taking into account said illumination dose.

A method according to the fourth aspect, wherein etching said substrate comprises forming a trench in said substrate, wherein said mask parameters comprise at least an etching depth for said trench.

A fifth aspect of the present invention relates to a method of designing a phase shift mask, said mask comprising at least a phase shifting structure, said mask being suitable for lithographic processing of a device using a predetermined illumination dose, the method comprising selecting a set of mask parameters, comprising at least a size of said phase shifting structure, taking into account said illumination dose.

A method according to the fifth aspect, wherein said selecting a set of mask parameters comprises selecting a plurality of sets of mask parameters suitable for using said phase shift mask substantially in focus and selecting from said plurality of sets of mask parameters at least one set of mask parameters suitable for using said phase shift mask with said illumination dose in a predetermined out of focus range.

A method according to any of the foregoing embodiments of the fifth aspect, said mask comprising at least a trench and light blocking parts, said mask parameters comprising at least a trench bias, a light blocking part bias and an etching depth of said trench, said mask being suitable for printing features on a device wherein selecting a plurality of sets of mask parameters suitable for using said phase shift mask substantially in focus comprises adjusting the light blocking part bias to correct a feature size and adjusting the trench bias to correct a feature position.

A method according to any of the foregoing embodiments of the fifth aspect, said mask comprising at least a trench and said mask parameters comprising at least an etching depth of said trench, said selecting at least one set of mask parameters suitable for using said phase shift mask with said illumination dose in a predetermined out of focus range, comprising selecting a set of mask parameters corresponding with a predetermined etching depth.

A method according to any of the foregoing embodiments of the fifth aspect, wherein said selecting at least one set of mask parameters suitable for using said phase shift mask with said illumination dose in a predetermined out of focus range comprises determining any of a focus-exposure matrix or an amount of feature displacement for a feature printable using said mask for said plurality of sets of mask parameters and evaluating said any of a focus exposure matrix or an amount of feature displacement for a feature printable using said mask.

A method according to any of the foregoing embodiments of the fifth aspect, wherein method comprises evaluating a focus-exposure window for a feature printable using said mask, wherein said focus-exposure window is determined by a common part of focus-exposure windows for at least two edges of said feature printable using said mask.

A sixth aspect of the present invention relates to a method for performing lithographic processing of a device, the method comprising using a phase shift mask comprising a phase shifting structure and using an illumination dose, wherein one of said phase shift mask and said illumination dose are selected as a function of the other.

A method according to the sixth aspect whereby for a predetermined illumination dose, said phase shift mask is made according to any of the foregoing methods according to the fourth aspect as described above.

A method according to the sixth aspect whereby for a predetermined illumination dose said phase shift mask is designed according to any of the foregoing methods according to the fifth aspect as described above.

A method according to any of the foregoing embodiments of the sixth aspect, wherein for a predetermined phase shift mask, an illumination dose is selected as function of mask parameters comprising a size of a phase shifting structure of said phase shift mask.

A seventh aspect of the present invention furthermore relates to a phase shift mask suitable for lithographic processing of a device using a predetermined illumination dose, the phase shift mask comprising a substrate with at least one means for generating a phase shift, a geometric size of said means for generating a phase shift being determined taking into account said illumination dose. Said geometrical size may be e.g. a thickness of a phase shift film or a depth of a trench in a transparent material. Said geometrical size may e.g. be a width and/or a depth of a trench or a width of a light blocking part.

An eight aspect of the present invention furthermore relates to a phase shift mask suitable for lithographic processing of a device using a predetermined illumination dose, the phase shift mask comprising a substrate with at least one phase shifting structure, and a geometric size of said phase shifting structure being determined taking into account said illumination dose.

An ninth aspect of the present invention relates to a computer program product for designing a phase shift mask according to any of the foregoing methods according to the second aspect or according to the fifth aspect for designing a phase shift mask as described above.

Certain inventive aspects furthermore relate to a machine readable data storage device storing such a computer program product comprising a computer program according to any of the foregoing embodiments of the ninth aspect.

Certain inventive aspects furthermore relate to the transmission of such a computer program product according to any of the foregoing embodiments of the ninth aspect over a local or wide area telecommunications network.

It is an advantage of embodiments that lithographic processing with a reduced image imbalance is obtained for a wide range of pitches.

It is also an advantage of embodiments that setting up lithographic processing with a phase shift mask according to embodiments requires less optimization.

It is furthermore an advantage of embodiments that lithographic processing can be performed resulting in line widths and line positions that are within the critical dimension and overlay specifications in a sufficiently large dose-focus window.

Certain inventive aspects are set out in the accompanying independent and dependent claims. Features from the dependent claims may be combined with features of the independent claims and with features of other dependent claims as appropriate and not merely as explicitly set out in the claims.

The teachings of certain inventive aspects permit the design of improved alternating phase shift masks resulting in improved lithographic processing.

The above and other characteristics, features and advantages of certain inventive aspects will become apparent from the following detailed description, taken in conjunction with the accompanying drawings, which illustrate, by way of example, the principles. This description is given for the sake of example only, without limiting the scope of the invention. The reference figures quoted below refer to the attached drawings.

Figure 1A:
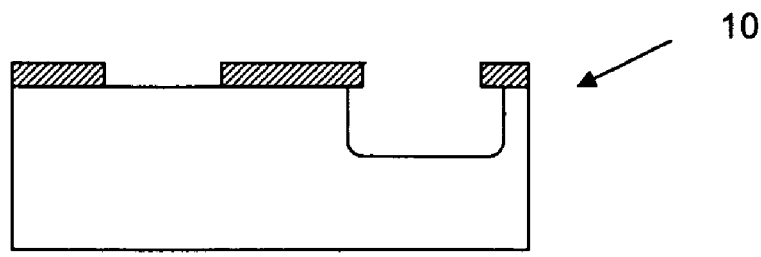
FIG. 1a to FIG. 1c show alternating phase shift masks comprising compensation features for image imbalance as known from prior art.
Figure 1B:
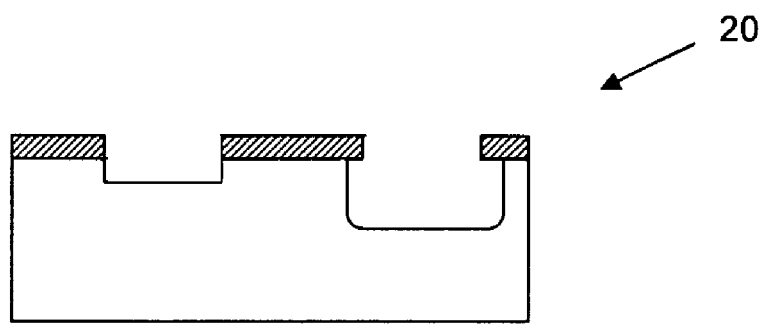
Figure 1C:
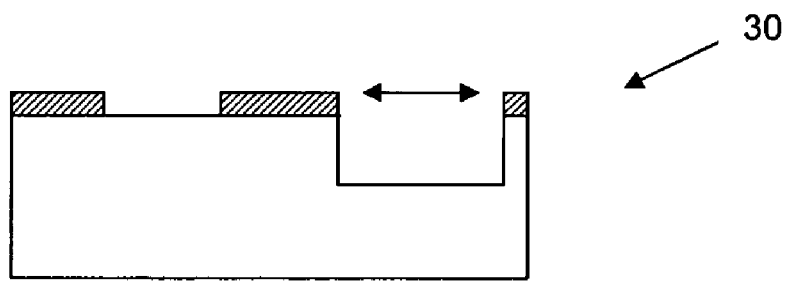
Figure 1D:
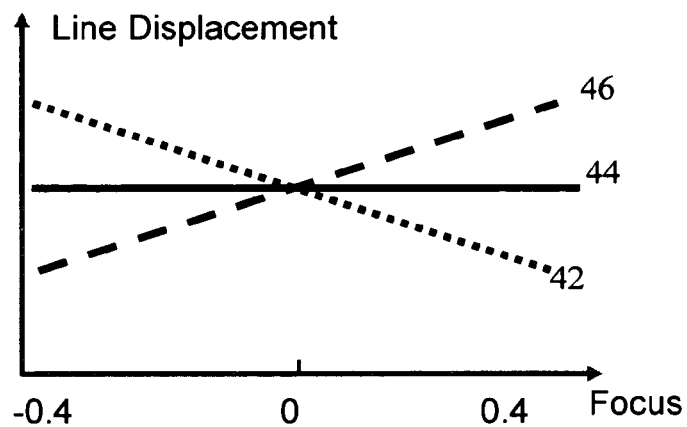
FIG. 1d shows a graph of the line displacement as a function of a phase error generated by an alternating phase shift mask.
Figure 1E:
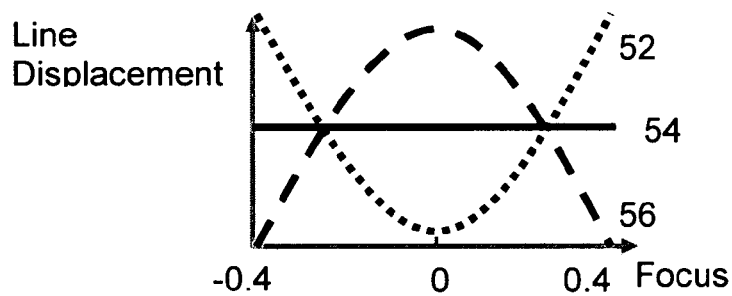
FIG. 1e shows a graph of the line displacement as a function of the phase error caused by trench bias differences of an alternating phase shift mask.

In the different figures, the same reference signs refer to the same or analogous elements.

DESCRIPTION OF CERTAIN ILLUSTRATIVE EMBODIMENTS

Certain inventive aspects will be described with respect to particular embodiments and with reference to certain drawings but these inventive aspects are not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Certain inventive aspects will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

A first embodiment relates to an alternating phase shift mask, which can e.g. be used for lithographic processing of a device. The alternating phase shift mask of the present embodiment has mask parameters determined taking into account the threshold of illumination or the dose of illumination that will be used in lithographic processing for the alternating phase shift mask manufactured according to embodiments of the present invention. The mask typically will contain mask features such that it can be used for generation of a pattern on a device. An alternating phase shift mask typically comprises, in parts of the mask that are not blocking, means for generating a phase shift near the mask features such that, at such locations, destructive interference occurs and features can be imaged with a high contrast. The means for generating a phase shift may be a phase shift generator or any suitable type of devices, such as e.g. a device for phase shifting comprising a phase shifting film or comprising a phase shifting substrate with regions having different optical thickness. In a preferred embodiment, the means for generating a phase shift may be a trench in a phase shifting substrate, which forms the basis of the mask. Alternating phase shift masks are known to generate image imbalance thus creating displacement of the printed features. Typically image imbalance generates line displacement, as shown in FIG. 1$d$ and FIG. 1$e$ for line displacement generated by phase errors in the phase shift mask and for line displacement caused by trench bias differences respectively. FIG. 1$d$ shows line displacements as function of the focus behaviour whereby curve 42 typically shows line displacement for a phase smaller than the optimum phase is present, curve 44 illustrates the line displacement when no phase error is made and curve 46 illustrates the line displacement when a phase larger than the optimum phase is present. FIG. 1$e$ shows line displacements as function of the focus behaviour whereby curve 52 shows typically line displacement for a too small trench bias, curve 54 shows typically line displacement for a correct trench bias and curve 56 shows typically line displacement for a too large trench bias.

Surprisingly it has been found that, for determining the parameters of the means for generating a phase shift, it is advantageous to take into account the dose of illumination that will be applied to the mask when used in lithographic processing. Taking into account this dose of illumination allows reduction of image imbalance created by the alternating phase shift mask. Depending on the type of means for generating an alternating phase shift, the parameters involved may be the depth of a trench provided in a phase shifting substrate, the width of the trench, the shape of the trench, the thickness of a phase shifting film, the width of the phase shifting film, etc. It is to be noted that the amount of illumination may be expressed using parameters such as the dose of illumination or the threshold of the aerial image. Both parameters are related to each other by $$\text{threshold} \propto \frac{1}{\text{dose}}.$$

Figure 2:
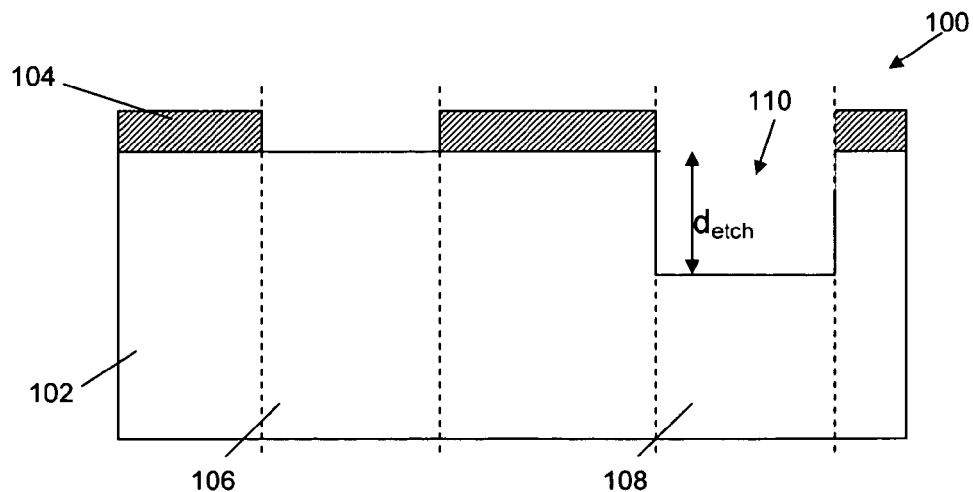
FIG. 2 shows an alternating phase shift mask with a trench depth taking into account the threshold of illumination, according to a first embodiment of the present invention.

By way of example, an alternating phase shift mask 100 is shown in FIG. 2, with a substrate 102, a patterned light blocking layer 104, such as e.g. a chromium layer, a first phase shift region 106 and a second phase shift region 108. The first phase shift region 106 is referred to as a 0 phase shift region, as it provides no other phase shift than the one provided by the full substrate thickness, whereas the second phase shift region 108 is referred to as a π phase shift region, as it provides a phase shift π with respect to light passing to the full substrate thickness. Such a π phase shift region is created by introducing a trench 110, such that the optical path length in the substrate 102 at the location of the trench 110 is substantially smaller. The etching depth $d_{etch}$ used for forming the trench 110 thus determines the phase shift that is provided.

The alternating phase shift mask 100 according to the present embodiment may allow obtaining a reduction in image imbalance for a large process window and for a large number of pitches.

The means for generating a phase shift furthermore may comprise a double trench, undercut or any other features for providing compensation for image imbalance, as known by the person skilled in the art. Furthermore, the mask 100 may comprise additional features that are typically used in lithographic processing; such as for example Optical Proximity Correction (OPC) features, as known by a person skilled in the art.

Figure 3:
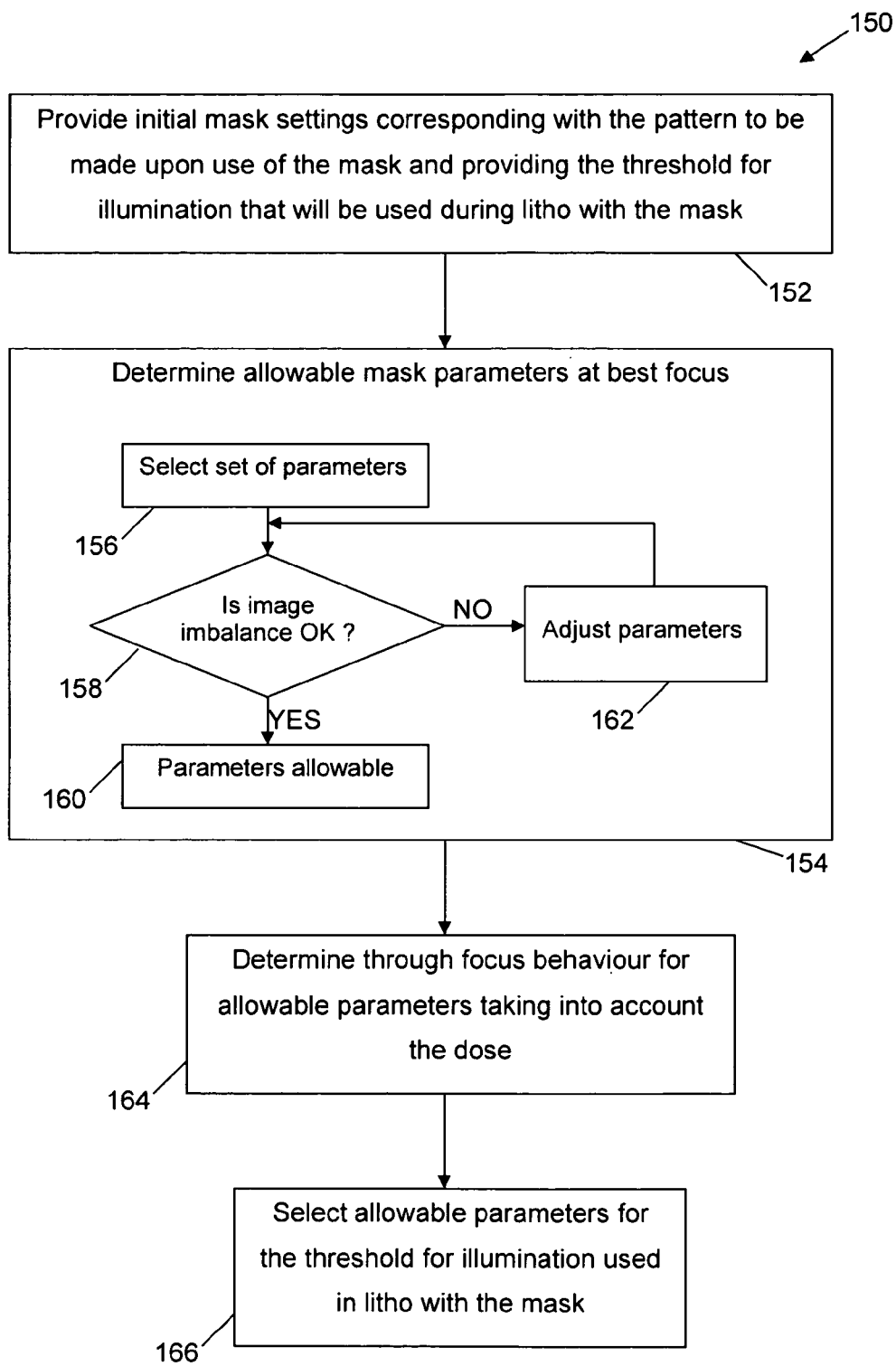
FIG. 3 shows a schematic overview of a method for designing an alternating phase shift mask according to embodiments of the present invention.

A second embodiment relates to a method for designing an alternating phase shift mask 100, whereby the amount of illumination, e.g. expressed by the dose of illumination or the threshold for illumination, used for illumination of the alternating phase shift mask 100 during its later use in lithographic processing is taken into account already during the design stage. More precisely, especially for reducing image imbalance in the through focus behaviour, taking into account the dose may lead to significant improvements. As the lithographic process is sensitive to variations in the focus depth one should not only determine the dimensions of the features printed on a substrate at the optimal focus but also at focus settings which deviate from this optimal focus setting. The sensitivity of the lithographic process will depend on the mask parameters of the mask as manufactured as these parameters may deviate from the determined optimal mask parameters, e.g. phase error, trench bias error. An example of a method for designing 150 according to the present embodiment may comprise following standard and/or optional steps, as shown by way of illustration in FIG. 3.

In a first step 152, the initial mask settings are provided. The initial mask settings typically correspond with conventional mask settings used by a person skilled in the art for obtaining a mask allowing creation of a pattern on a device during lithographic processing. These conventional mask settings typically may comprise an initial etch depth $d_{etch}$, an initial dose and typical pitches in agreement with the pattern to be made on the device during lithographic processing using the mask. Further settings of the mask, such as an initial bias for the light blocking material, such as e.g. an initial Chromium bias, and an initial trench bias may be selected.

In a second step 154, allowable mask parameters are determined for best focus behaviour, whereby the allowable mask parameters are determined for a wide range of doses, i.e. for a wide range of thresholds for illumination that will be used during lithographic processing of a device with the mask 100. Determining allowable mask parameters may e.g. be performed using the following steps. A set of mask parameters may be selected, as shown in step 156. These parameters can be based on the initial mask parameters provided in the first step 152, whereby several parameters may be varied within predetermined ranges. In a decision step 158, it is checked whether the image imbalance at best focus is under control, i.e. whether the image imbalance is not too large. The amount of image imbalance that is allowed depends on the specific lithographic processing. The latter may e.g. comprise evaluating whether the printed feature is at the correct position and has the correct width/lateral dimensions. It may comprise evaluating the position of the edges of the features separately. If the image imbalance at best focus is sufficiently small, the set of parameters are evaluated as allowable, as shown in step 160. These parameters may e.g. be stored in a memory and/or these parameters may e.g. be outputted. If the image imbalance is not sufficiently controlled, the parameters may be adjusted, as shown in step 162, and new evaluation of the image imbalance may be made. Typical parameters that may be adjusted are the light blocking part bias, such as e.g. the chromium bias, in order to get the correct resist feature size, e.g. line width, and/or the trench bias to get the correct feature position, although the invention is not limited thereto. These parameters typically are evaluated for a setting of a dose in a predetermined range, an etching depth in a predetermined range and a pitch in a predetermined range. Such variation may be done systematically such that a whole parameter space is evaluated for predetermined ranges of each parameter. The evaluation preferably is done by simulating the obtained results for an alternating phase shift mask determined by the selected parameters and using the provided dose, although the latter in principle also could be determined through theoretical calculations or through experiments. A typical simulation engine that may be used is Prolith as available from KLA-Tencor, such as e.g. Protlith version 8.1 comprising the mask topography option. To determine the optimum mask parameters, rigorous simulation of the electromagnetic effects of light transmission through the mask topography may be used.

After selecting a number of allowable mask parameters for best focus behaviour, the through focus behaviour is determined for the allowable mask parameters, as shown in step 164. The allowable mask parameters thereby typically may be allowable settings for the light blocking part bias and trench bias for a given dose, a given etching depth and a given pitch. Determining the through focus behaviour, i.e. the behaviour for focus settings differing from the best focus, may comprise calculating a mask error enhancement factor, a focus—exposure matrix for the features provided on the mask, positional information of the features provided on the mask and a line displacement slope for different pitches as a function of the dose. Typically, for an optimised trench bias and light blocking part bias, studying the line displacement slope as a function of the dose may allow evaluation of the through focus behaviour. Taking into account the obtained results, selection of the optimum etching depth taking into account the adequate dose is performed for the through focus behaviour, or selection of the optimum dose taking into account the adequate etching depth is performed for through focus behaviour, whereby the selection is made from the sets of allowable mask parameters. The latter typically results in optimum mask parameters for both best focus and through focus behaviour. Such parameters selected during step 166 may e.g. be used as input for a manufacturing method for making a phase shift mask.

It is an advantage of certain embodiments that the illumination dose is taken into account for matching the etch process to the optimum etch depth. In other words, either the optimum etch depth may be altered for a given dose or for a given etch depth an optimum dose may be selected. In one embodiment of the present invention the etch process may be selected taking into account a given dose. It is known from Philipsen et al. in proceedings of the PhotoMask Japan PMJ conference 2004, that different etches, and thus different etch depths, may lead to alternating phase shift masks having different properties. Taking into account the dose of illumination, an optimum selection of the etch for making an alternating phase shift mask may be selected.

The evaluation processes may be performed in an automated way e.g. based on specific computer implemented algorithms, neural networks, etc. The method of designing may e.g. make use of software means such as electronic design automation tools. Starting from an initial design, a new design can be generated by manipulating the pattern info of this given design by means of software, e.g. varying the dimensions, deleting or adding features, etc.

In the exemplary method 150, first optimisation for image imbalance reduction is performed at best focus behaviour and subsequently optimisation is performed for image imbalance reduction at through focus behaviour. It is to be noted that these steps may be altered in timing, i.e. such that first optimisation for image imbalance reduction is performed at through focus behaviour and then optimisation for image imbalance reduction is performed at best focus behaviour. Furthermore optimisation of the mask parameters is performed as a function of the adequate dose. In an alternative embodiment, selection of an adequate dose may be performed for a given etch depth, e.g. if a given etch process is to be used.

Figure 4:
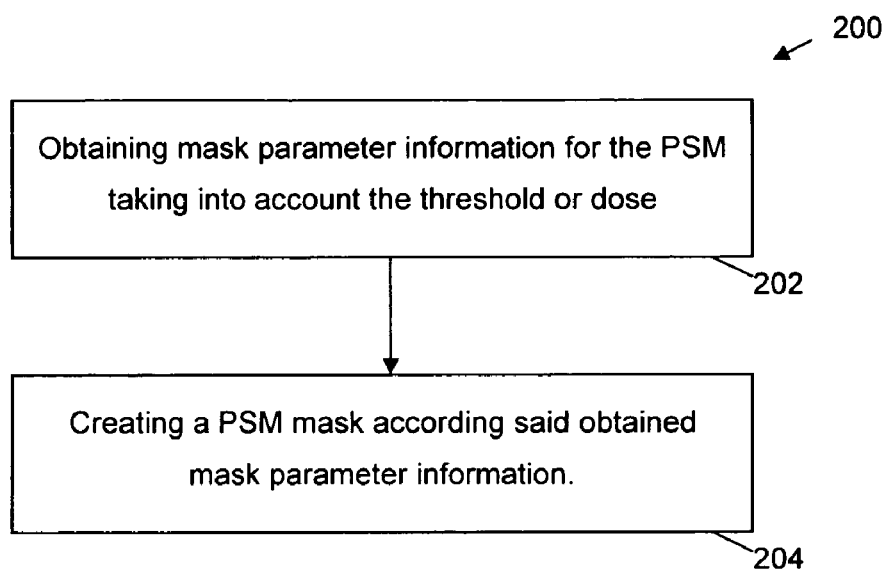
FIG. 4 shows a schematic overview of a method for constructing an alternating phase shift mask according to embodiments of the present invention.

A third embodiment relates to a method of making a phase shift mask 100. In the present embodiment, the method for making the phase shift mask 100 is characterised by taking into account the threshold for illumination which will be used in the lithographic process for which the phase shift mask will be used, for determining the optimum mask parameters. In other words the dose or threshold that will be used for lithographic processing with the phase shift mask 100 under construction, is taken into account. The method 200 for creating a mask is illustrated by way of example in FIG. 4. The method 200 for creating a mask comprises the step 202 of obtaining mask parameters for a phase shift mask according to any of the device embodiments as described above. The mask parameters of the phase shift mask thus are obtained taking into account the dose of the illumination in the lithographic processing for which the phase shift mask will be used. The step 202 of obtaining may comprise receiving the necessary mask information or determining, e.g. calculating, measuring and/or deriving, the necessary mask information. In a specific embodiment, the step of obtaining may comprise the method 150 of designing a phase shift mask 100 as e.g. described in the second embodiment of the present invention. In a second step 204, the mask will be generated, using the mask parameters as obtained in step 202. As the actual technique used for shifting the phase of light on a mask is not limiting in the embodiment of the present invention, a number of different manufacturing steps for the production of the phase shift mask may be introduced. Typical method steps for the creation of a phase shift mask may comprise deposition of layers, lithographic processing of layers, etching steps and/or any other suitable construction or treatment step. By way of example, illustration of the mask creation will be provided for a phase shift mask wherein the phase shift of the light stems from the light travelling different optical path lengths in a phase shifting substrate material.

Two different processes for illustrating lithographic processing steps for creating an exemplary phase shift mask are illustrated in FIG. 5a to FIG. 5h and in FIG. 6a to FIG. 6i by way of example.

Figure 5A:
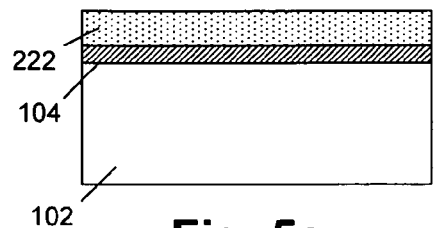
FIG. 5a to FIG. 5h show different intermediate stages of an alternating phase shift mask during a method of construction of such a mask according to embodiments of the present invention.
Figure 5B:
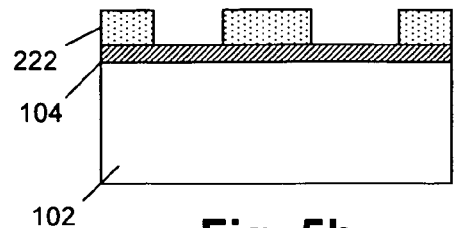
Figure 5C:
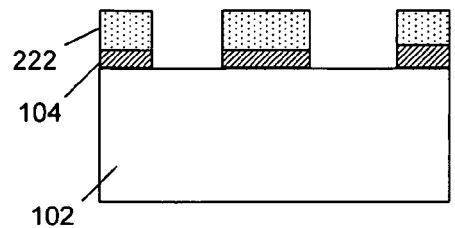
Figure 5D:
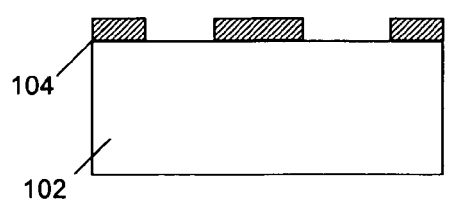
Figure 5E:
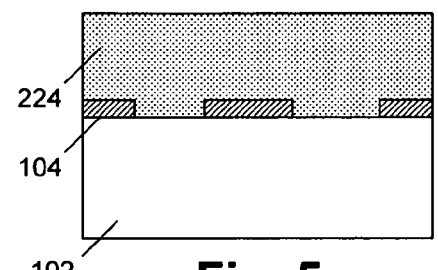
Figure 5F:
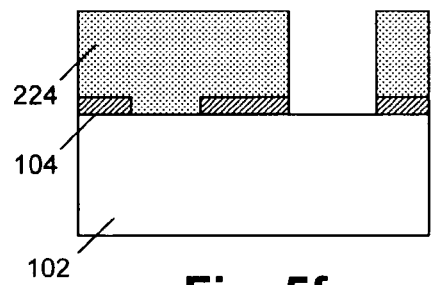
Figure 5G:
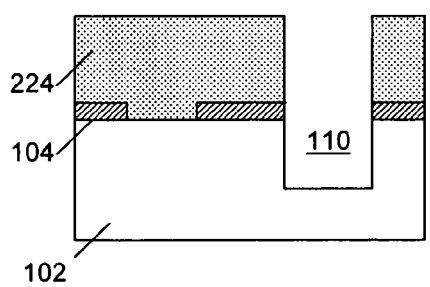
Figure 5H:
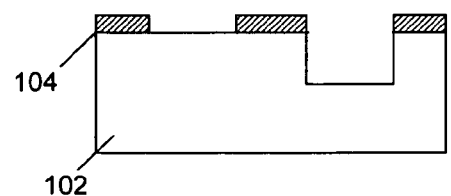

In a first example, the method of creating or constructing a phase shift mask 100 according to obtained mask parameter information comprises the step of creating means for generating a phase shift and the step of providing a blocking layer on the substrate in agreement with a pattern to be formed on a device, when the mask is used during lithographic processing. Creating means for generating a phase shift may e.g. be creating trenches in a phase shifting substrate. According to certain embodiments, the etching depth $d_{etch}$ of the trenches may be determined taking into account the dose or threshold of illumination that will be used on the lithographic system with the phase shift mask 100. The latter may be done by selecting e.g. a specific type of etch or by selecting specific timings for an etch. A first example is shown in FIG. 5a to FIG. 5h. First a substrate 102, typically made of a transparent material such as for example quartz or CaF is coated with a light blocking layer 104, such as e.g. a chrome layer, and coated with a resist layer 222. Subsequently, the resist 222 is illuminated according to a pattern, developed and removed, such that no resist is present where no light blocking material is to be present, as shown in FIG. 5b. In a following step, the light blocking material pattern is created by etching light blocking material away according to the resist pattern, as shown in FIG. 5c. Subsequently, the remaining resist material 222 may be removed, as shown in FIG. 5d. In a further step a new resist layer 224 is applied, as shown in FIG. 5e and resist is removed where a trench is to be formed, as shown in FIG. 5f. In a following step, a trench 110 is etched, as shown in FIG. 5g. The length of the etching process thereby is determined by the mask parameters provided, thus the etch depth takes into account the dose or threshold for illumination that will be used in the lithographic processing performed with the phase shift mask 100 constructed according to the present embodiment. After the remaining resist is removed, a phase shift mask as shown in FIG. 5h is obtained.

Figure 6A:
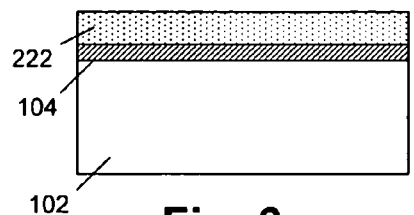
FIG. 6a to FIG. 6i show different intermediate stages of an alternating phase shift mask during an alternative method of construction of such a mask according to embodiments of the present invention.
Figure 6B:
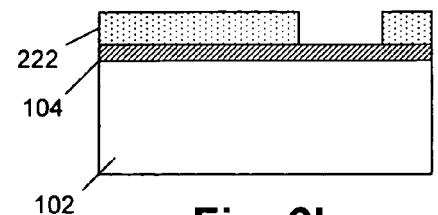
Figure 6C:
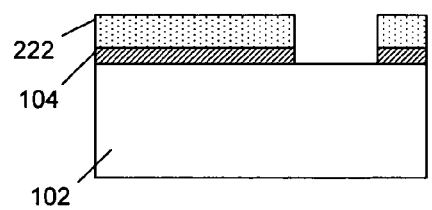
Figure 6D:
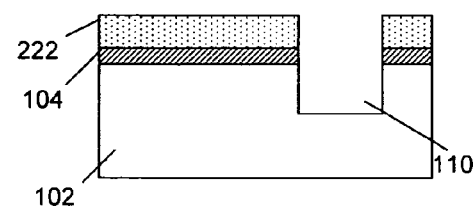
Figure 6E:
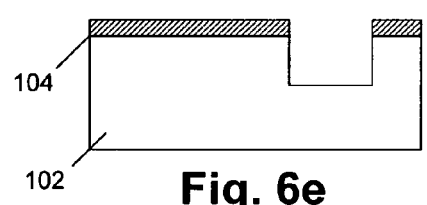
Figure 6F:
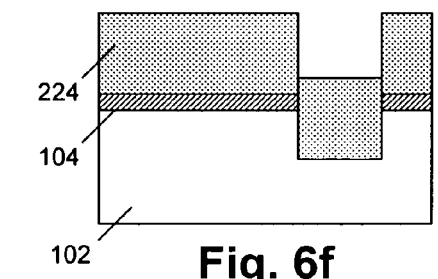
Figure 6G:
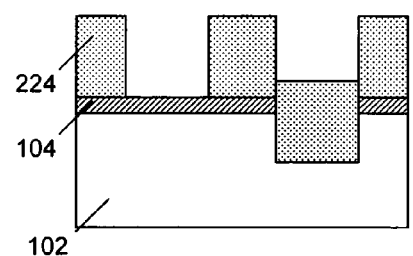
Figure 6H:
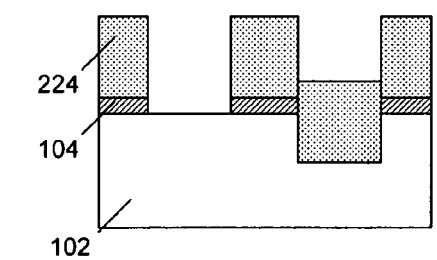
Figure 6I:
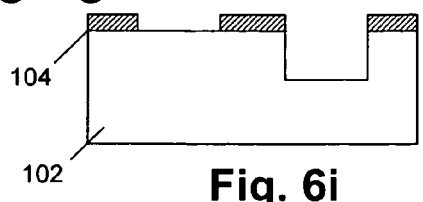

In a second example, creation of a means for generating a phase shift and provision of a light blocking pattern is obtained in a slightly different way. In a first step, a substrate 102, typically made of transparent material, is provided with a light blocking layer 104, such as e.g. a chromium layer although the invention is not limited thereto, and a resist layer 222, as shown in FIG. 6a. The resist 222 is then selectively removed at places where a trench 110 is to be formed, shown in FIG. 6b, and the light blocking layer 104 is selectively removed, shown in FIG. 6c, whereafter a trench 110 is formed, as can be seen in FIG. 6d. The etching of the trench 110 is performed such that for the obtained etch depth or trench depth the dose with which the mask 100 will be illuminated during its use in lithographic processing is taken into account. In a following step the remaining resist 222 is removed, as shown in FIG. 6e. After formation of the trench 110, the light blocking layer 104, e.g. chromium layer is patterned using a resist layer 224, as can be seen in FIG. 6f, by selectively removing the resist layer 224, shown in FIG. 6g, subsequently selectively etching the non-covered light blocking layer 104, as shown in FIG. 6h, and by removing the resist layer 224. The same phase shift mask 100 as in the previous example is obtained.

It is to be understood that the above examples are only provided by way of illustration and that these are not limiting the inventive scope. The type of lithography process, e.g. type of resist, type of irradiation, etc. and the specific way of forming the means for generating a phase shifting means and for forming the patterned non-blocking layer is not limiting the inventive scope. Different processes may be known by a person skilled in the art, but in certain embodiments, during formation of the trench, the etching depth will be determined taking into account the threshold or dose for illumination by which the mask 100 will be irradiated during use in lithographic processing.

In a further embodiment, when the etch depth as a function of the pitch is known, e.g. from Philipsen et al. in proceedings of the PhotoMask Japan PMJ conference 2004, an adequate dose choice allows to compensate micro-loading errors during mask fabrication.

In a fourth embodiment, the phase shift mask according to embodiments of the present invention is used in lithographic processing of a device. In other words, the fourth embodiment relates to a method of lithographic processing of a device using a phase shift mask 100 according to embodiments of the present invention, whereby the phase shift mask 100 is constructed taking into account the threshold for illumination or dose of illumination used for lithographic processing with the mask 100, or in other words, whereby the threshold for illumination or dose of illumination used for determining the optimum phase shift mask 100 is used during lithographic processing. The latter allows obtaining a high degree of reduction of image imbalance, resulting in improved lithographic processing. The lithographic processing thus obtained allows obtaining a good print quality for a large processing window, thus resulting in a high yield of devices made. Furthermore, the latter also allows obtaining a through-pitch solution to print e.g. 65 nm lines whereby the image imbalance is taken into account. Typically such lithographic processing comprises covering a device with a resist layer, illuminating said resist layer using the mask, thus providing an illumination pattern on the resist layer and developing said resist in order to obtain a patter in the resist. Either positive or negative resists may be used in combination with a corresponding mask pattern, as well known by a person skilled in the art. In an alternative embodiment, for a phase shift mask made using a specific etch depth, lithographic processing may be used, whereby the dose of illumination to be used for illuminating the phase shift mask may be determined taking into account the etch depth used for the mask. In other words, the focus-exposure matrices of the edges of printed features are analysed in order to capture the line displacement due to image imbalance in the process window. It is an advantage that the position of the edges of the feature are evaluated separately, thus allowing an improved lithographic process compared to evaluation of the size of the whole feature.

Figure 7:
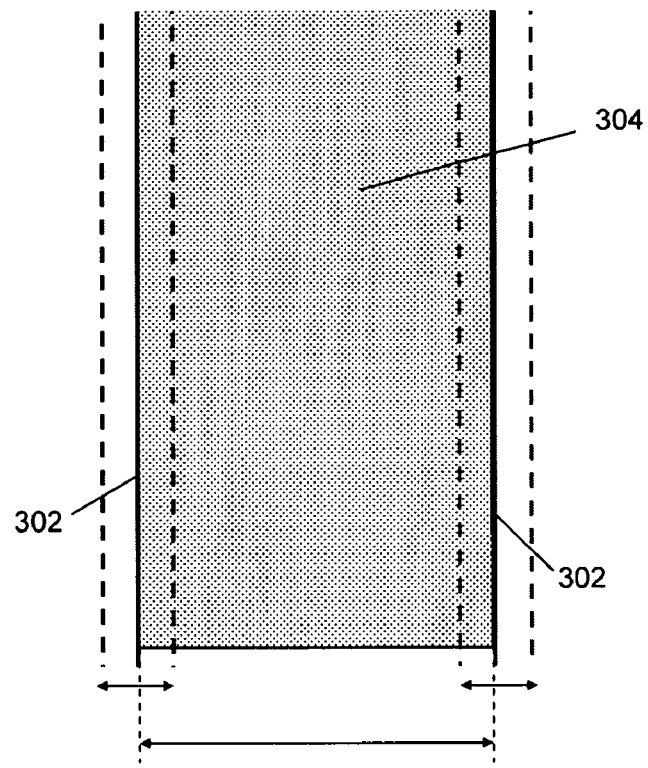
FIG. 7 illustrates the displacements for each of the edges of a printed feature, as is used to evaluate image imbalance in methods according to embodiments of the present invention.
Figure 8:
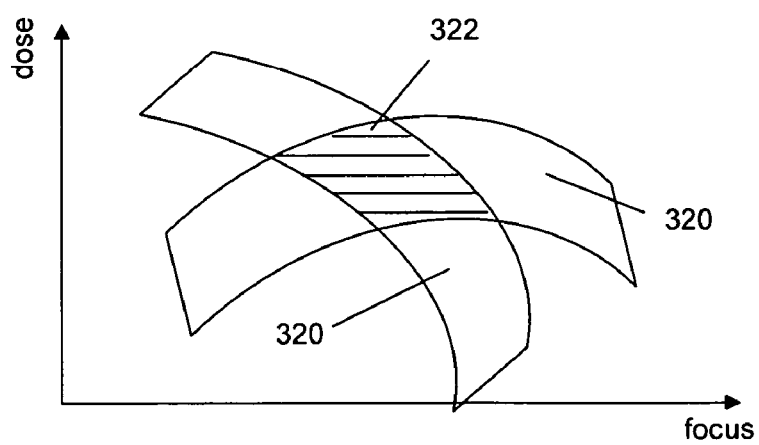
FIG. 8 illustrates the focus-dose process window as used for evaluation of the image imbalance, according to embodiments of the present invention.

In a fifth embodiment, the present invention relates to a method 150 of designing a phase shift mask 100, a method 200 for making a phase shift mask 100 or a method of lithographic processing using a phase shift mask 100, wherein the quality of the phase shift mask 100 is determined using a process window derived from the image imbalance for the edges of the mask features. The process window for evaluating imaging imbalance may be selected based on the position of the edges 302 of printed features 304 or simulated printed features and is not solely based on the width of printed features 304. The imaging imbalance of the phase shift mask 100 or the quality of the corresponding lithographic process is evaluated within the specific process window. FIG. 7 illustrates how the edges 302 of a printed line 304 and the line shift caused by the image imbalance, can be taken into account for evaluating image imbalance. Whereas typically the feature size, e.g. line width, is taken into account for evaluating the focus-exposure window or processing window, in the present embodiment the position of the edges 302 of the feature 304, e.g. line, are taken into account. In particular, the process windows 320 are determined for each edge 302 and the process window 322 used for evaluating is extracted as the overlapping region of these process windows 320. The process window 320 for an edge may be determined in any suitable way, such as e.g. based on obtaining a 10% difference between the design and the obtained structure. Extraction of the processing window 322 for evaluation is illustrated in FIG. 8, the dashed area indicating the process window for the lithographic processing of the specific feature 304 under study.

Figure 9:
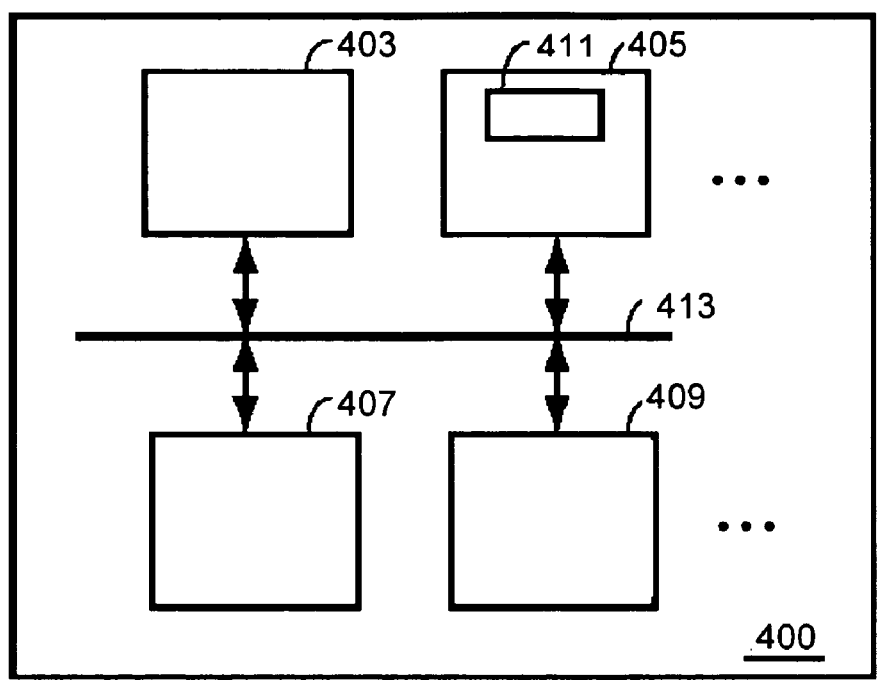
FIG. 9 shows a processing system adapted for performing at least part of any of the method embodiments according to the present invention.
Figure 10A:
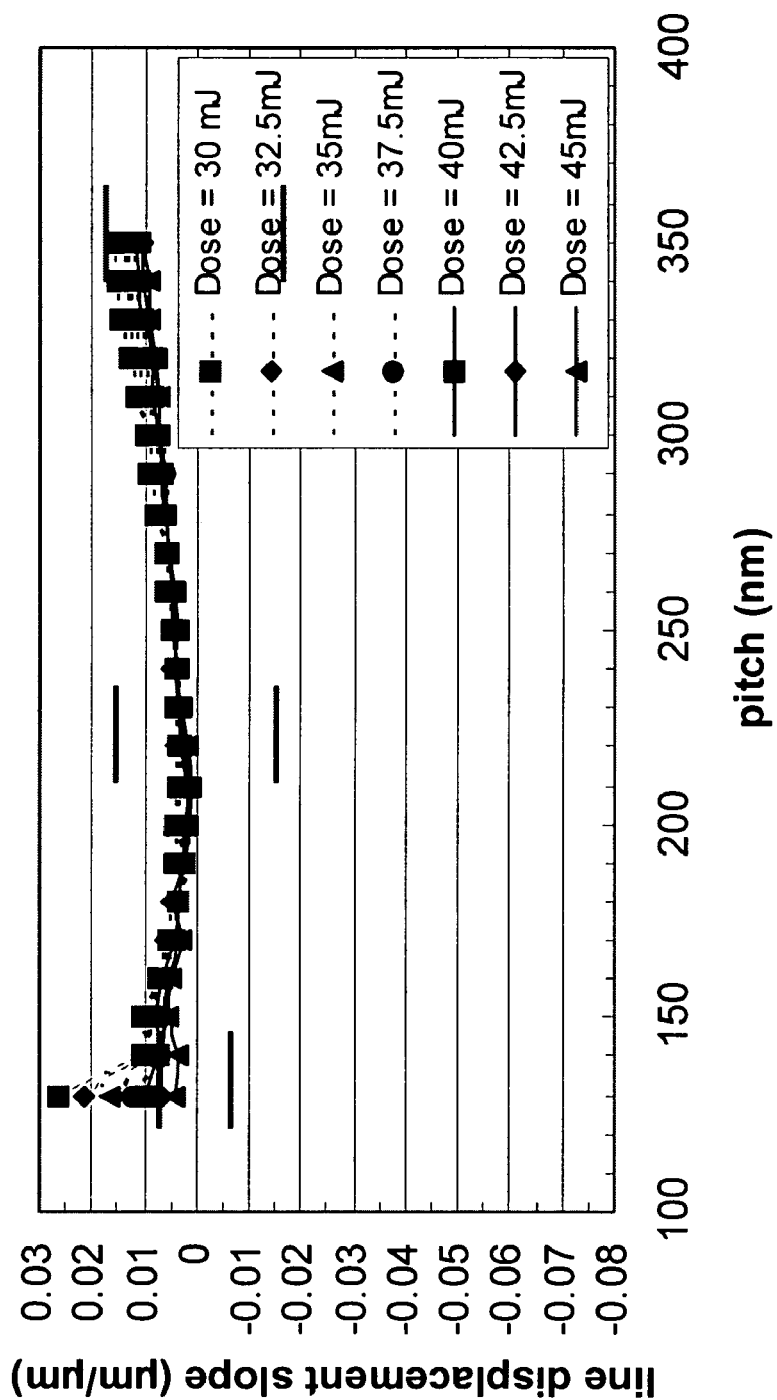
FIG. 10a to FIG. 10g show graphs of the line displacement slopes as a function of pitches for different doses of illumination used during lithographic processing with the corresponding alternating phase shift mask and for different etching depths used.
Figure 10B:
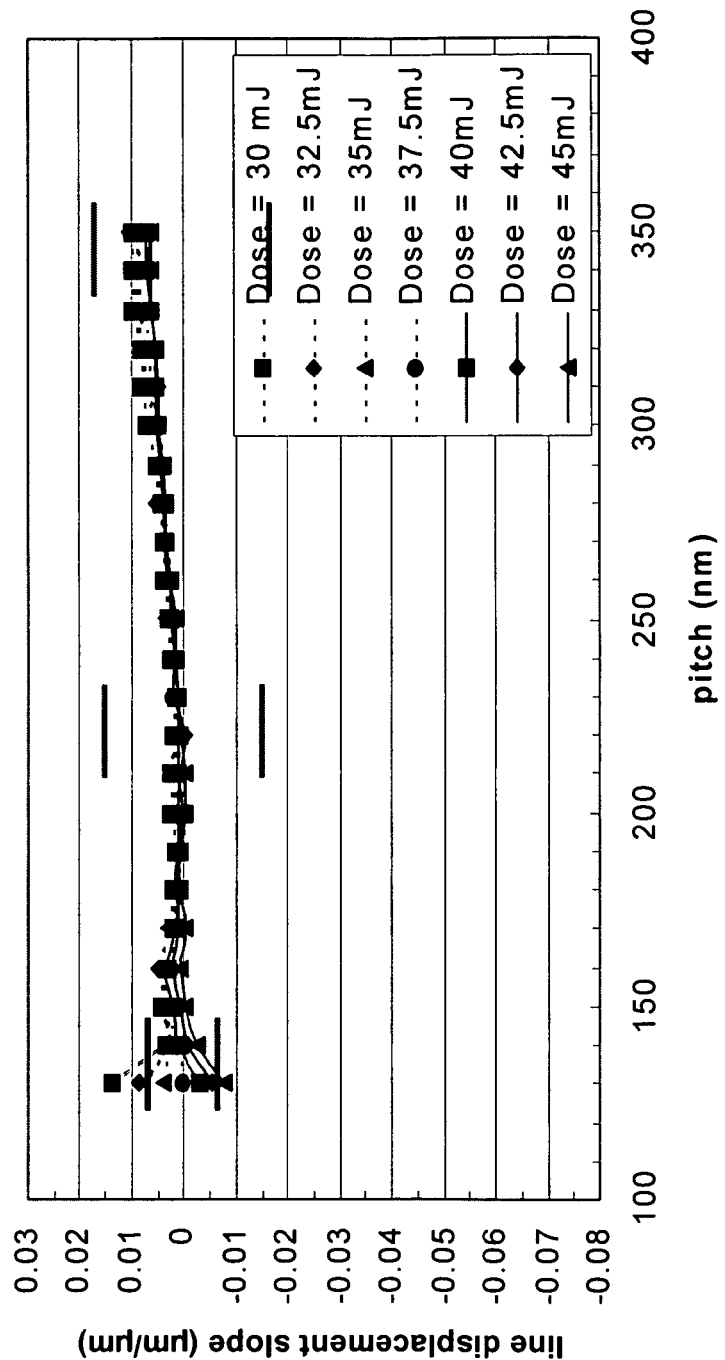
Figure 10C:
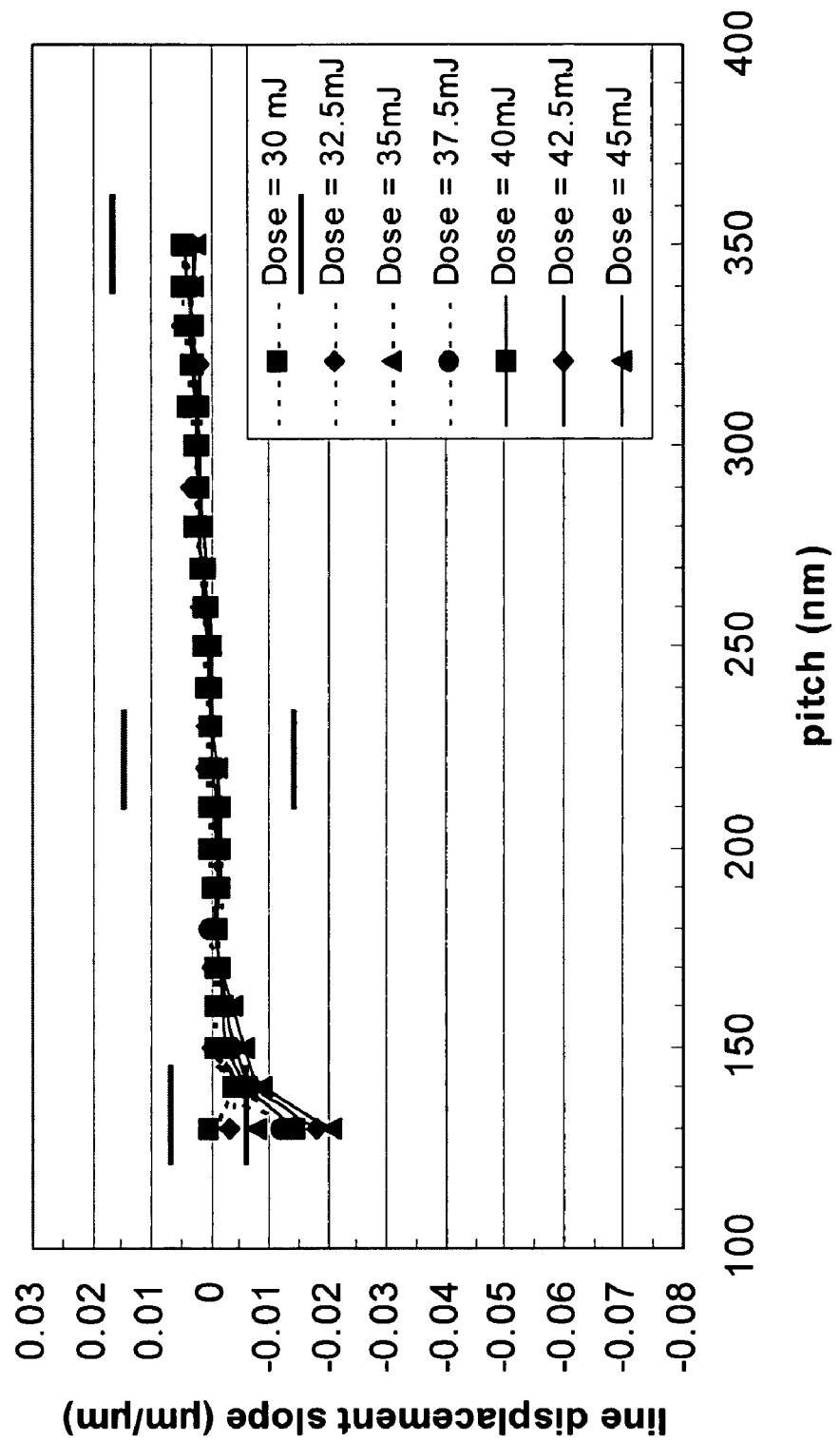
Figure 10D:
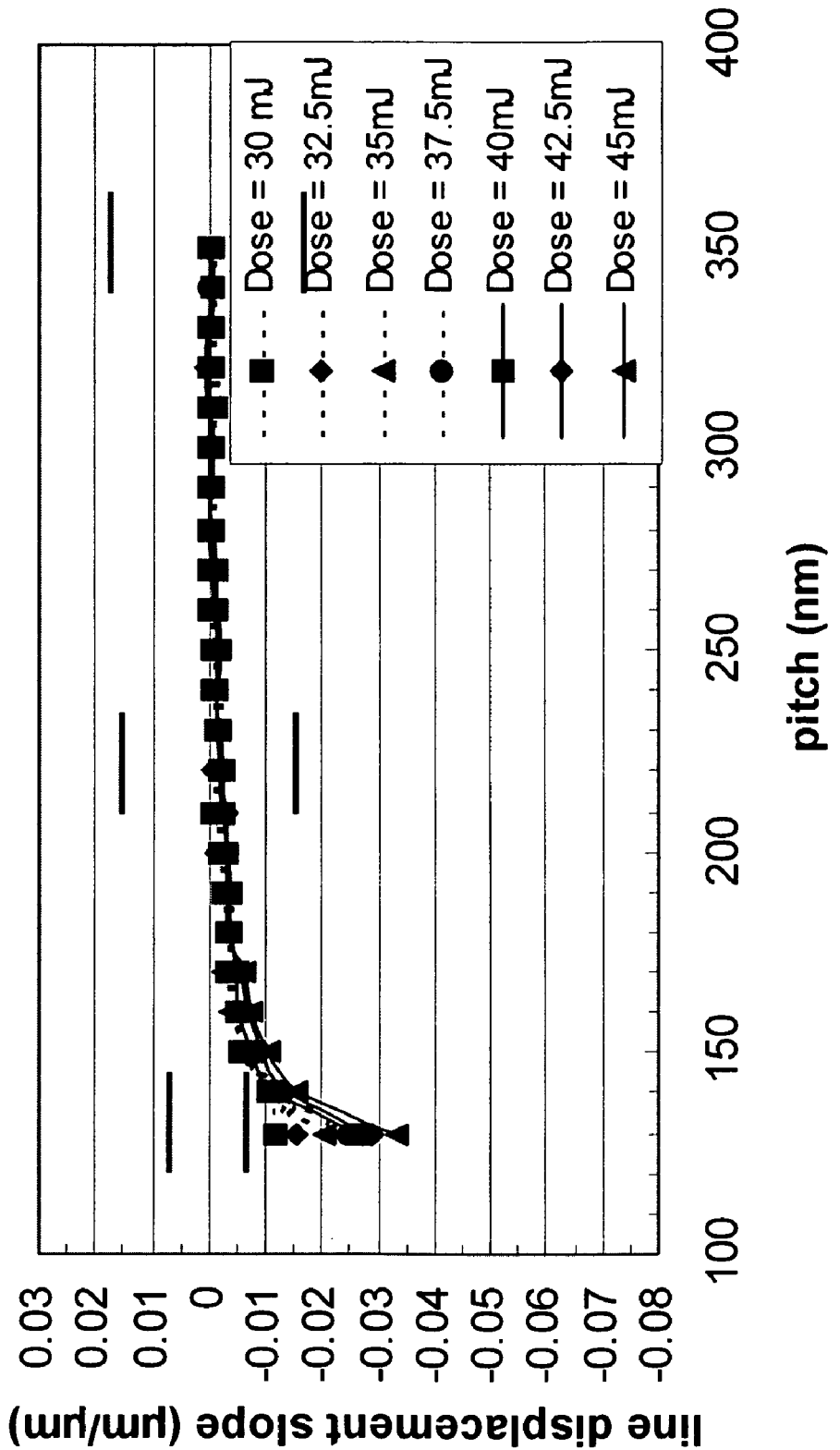
Figure 10E:
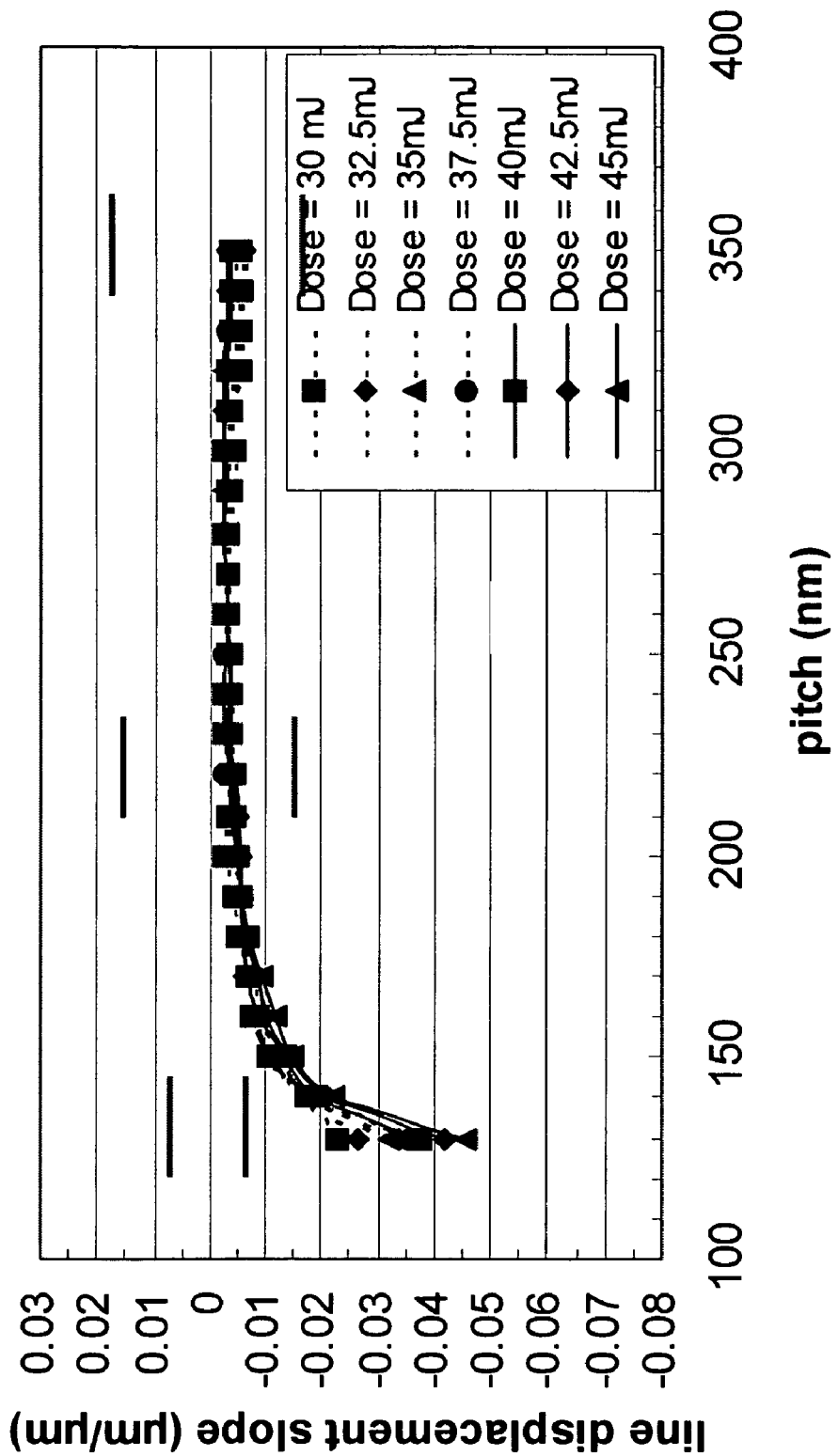
Figure 10F:
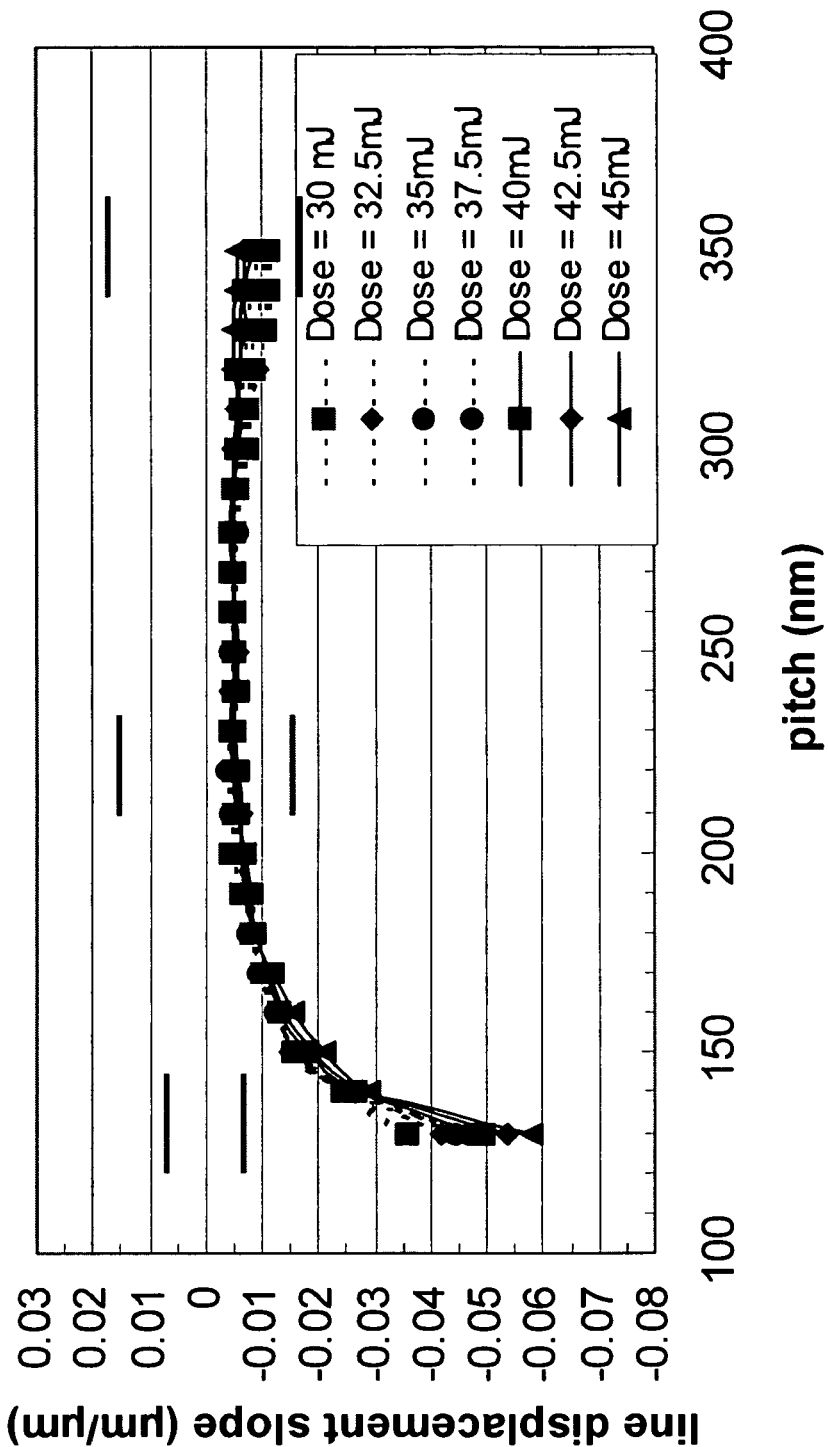
Figure 10G:
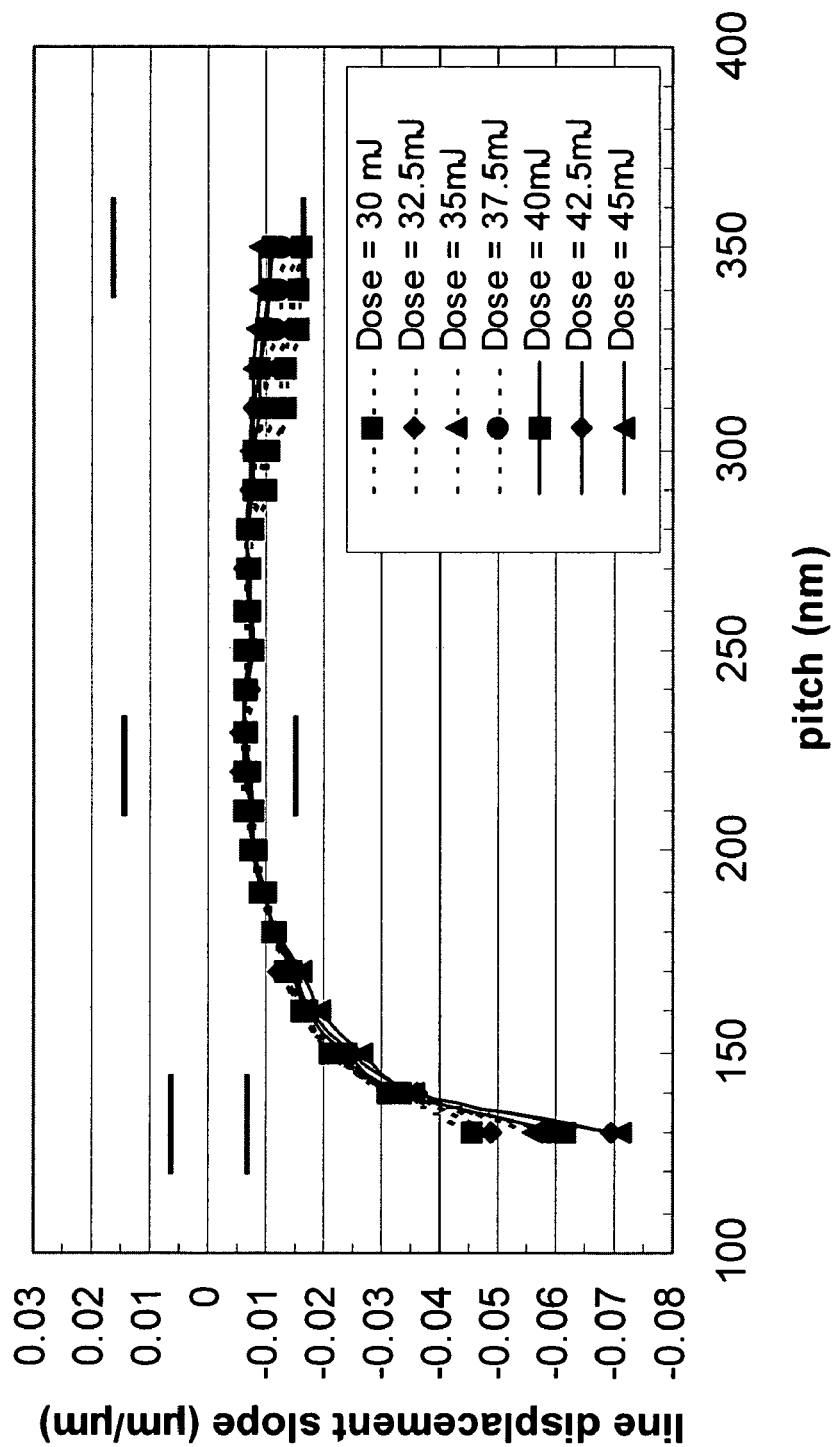

A sixth embodiment relates to a processing system wherein the designing or creating method embodiments according to the present invention are at least partly implemented, or in other words, to a processing system adapted for performing a method for designing or creating an alternating phase shift mask wherein the dose is taken into account for determining the mask parameters. An exemplary processing system 400 is shown in FIG. 9. FIG. 9 shows one configuration of processing system 400 that includes at least one programmable processor 403 coupled to a memory subsystem 405 that includes at least one form of memory, e.g., RAM, ROM, and so forth. A storage subsystem 407 may be included that has at least one disk drive and/or CD-ROM drive and/or DVD drive. In some implementations, a display system, a keyboard, and a pointing device may be included as part of a user interface subsystem 409 to provide for a user to manually input information. Ports for inputting and outputting data also may be included. More elements such as network connections, interfaces to various devices, and so forth, may be included, but are not illustrated in FIG. 9. The various elements of the processing system 400 may be coupled in various ways, including via a bus subsystem 413 shown in FIG. 9 for simplicity as a single bus, but will be understood to those in the art to include a system of at least one bus. The memory of the memory subsystem 405 may at some time hold part or all (in either case shown as 411) of a set of instructions that when executed on the processing system 400 implement the step(s) of the method embodiments described herein. Thus, while a processing system 400 such as shown in FIG. 9 is prior art, a system that includes the instructions to implement aspects of the present invention is not prior art, and therefore FIG. 9 is not labelled as prior art.

It is to be noted that the processor 403 or processors may be a general purpose, or a special purpose processor, and may be for inclusion in a device, e.g., a chip that has other components that perform other functions. Thus, one or more aspects of the present invention can be implemented in digital electronic circuitry, or in computer hardware, firmware, software, or in combinations of them. Furthermore, aspects of the invention can be implemented in a computer program product tangibly embodied in a carrier medium carrying machine-readable code for execution by a programmable processor. Method steps of aspects of the invention may be performed by a programmable processor executing instructions to perform functions of those aspects of the invention, e.g., by operating on input data and generating output data. Accordingly, certain embodiments include a computer program product which provides the functionality of any of the methods according to certain embodiments when executed on a computing device. Further, certain embodiments include a data carrier such as for example a CD-ROM or a diskette which stores the computer product in a machine-readable form and which executes at least one of the methods of the invention when executed on a computing device. Nowadays, such software is often offered on the Internet or a company Intranet for download, hence certain embodiments include transmitting the computer product over a local or wide area network.

Specific examples and advantages of embodiments of the present invention will be illustrated by exemplary experiments for the 65 nm half pitch node for ArF lithography with a numerical aperture of 0.85 nm, indicating the surprisingly significant influence of the dose on the image imbalance caused by a mask and the correlation with the mask parameters.

Figure 11:
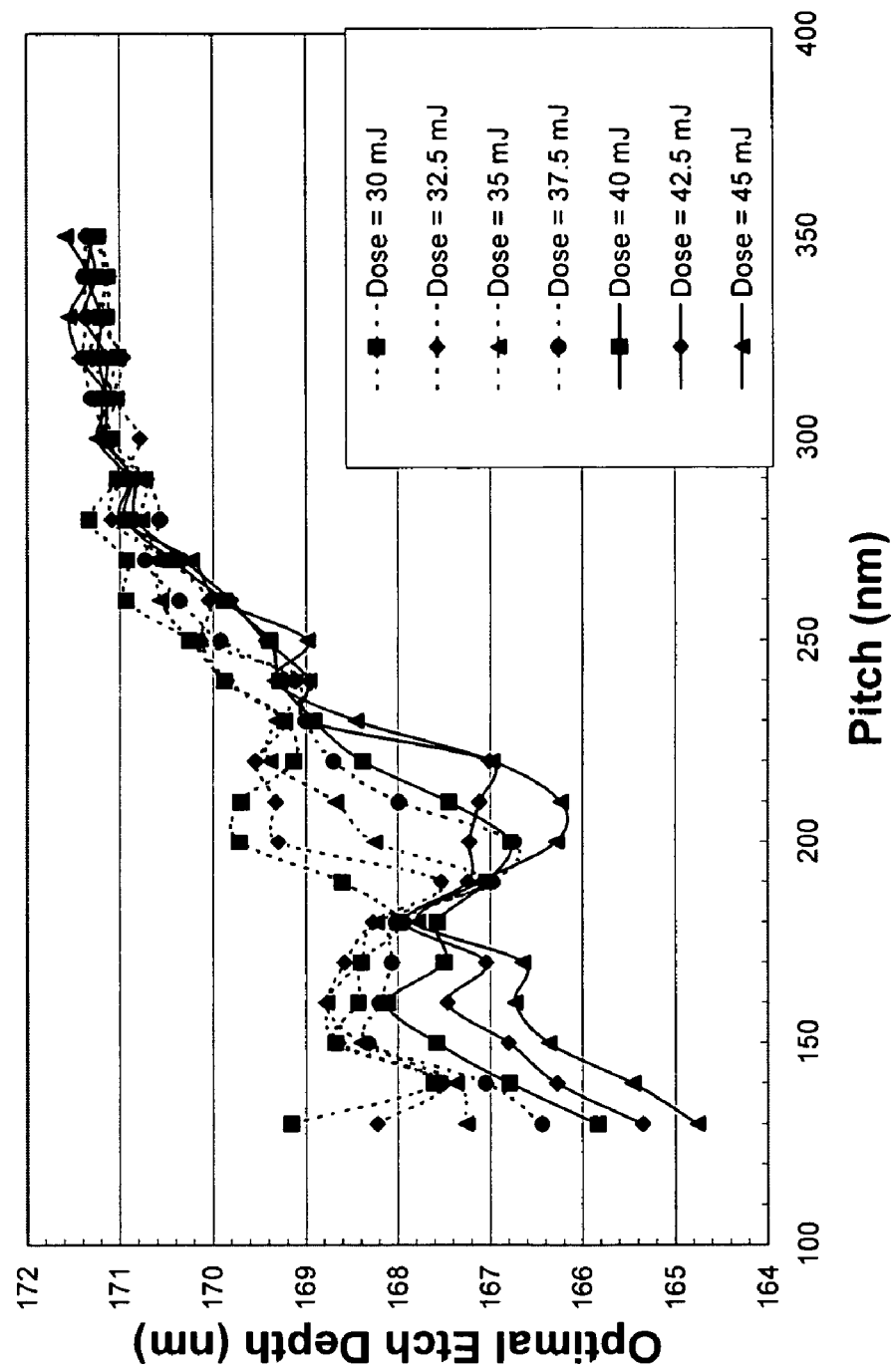
FIG. 11 shows a graph of the optimal etch depth as a function of the pitch for different doses of illumination used during lithographic processing with the corresponding alternating phase shift mask.

In a first experiment, the line displacement in micrometer per micrometer defocus is studied for different dose and different pitches, using different etch depths, i.e. using different trench depths. These results are illustrated in FIG. 10a to FIG. 10g for an etch depth of 163.9 nm, 166.4 nm, 168.9 nm, 171.4 nm, 173.9 nm, 176.4 nm and 178.9 nm respectively. The short horizontal lines at each pitch thereby indicate the tolerance/process window/margin of the line displacement slope at that pitch. In the different drawings, it is indicated that dependent on the dose the etch depth may lead to allowable image imbalance or unallowable image imbalance. The latter can be seen from the fact that results are obtained falling without the tolerance/process window/margin of the line displacement slope for some pitches. The latter confirms that taking into account the dose for determination of the etch depth to be used or, vice versa, taking into account the etch depth used for determination of the dose may lead to significant advantages, thus supporting the embodiments of the present invention. FIG. 11 illustrates a graph of the etch depth as a function of the pitch for different doses such that an optimally reduced image imbalance occurs. The latter also indicates that, for designing or making a mask, taking the illumination dose into account may result in different etch depths. Using other etch depths then results in increased image imbalance.

Figure 12A:
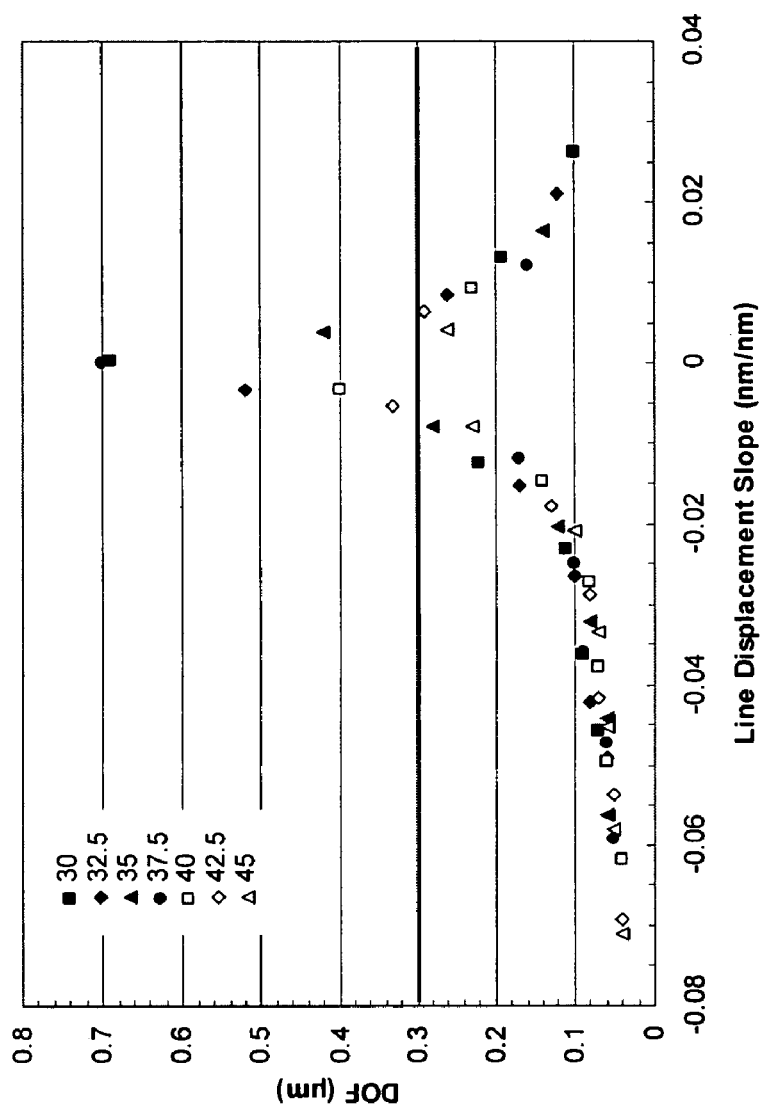
FIG. 12a to FIG. 12b shows a graph of the depth of focus as a function of the line displacement slope for different pitches.
Figure 12B:
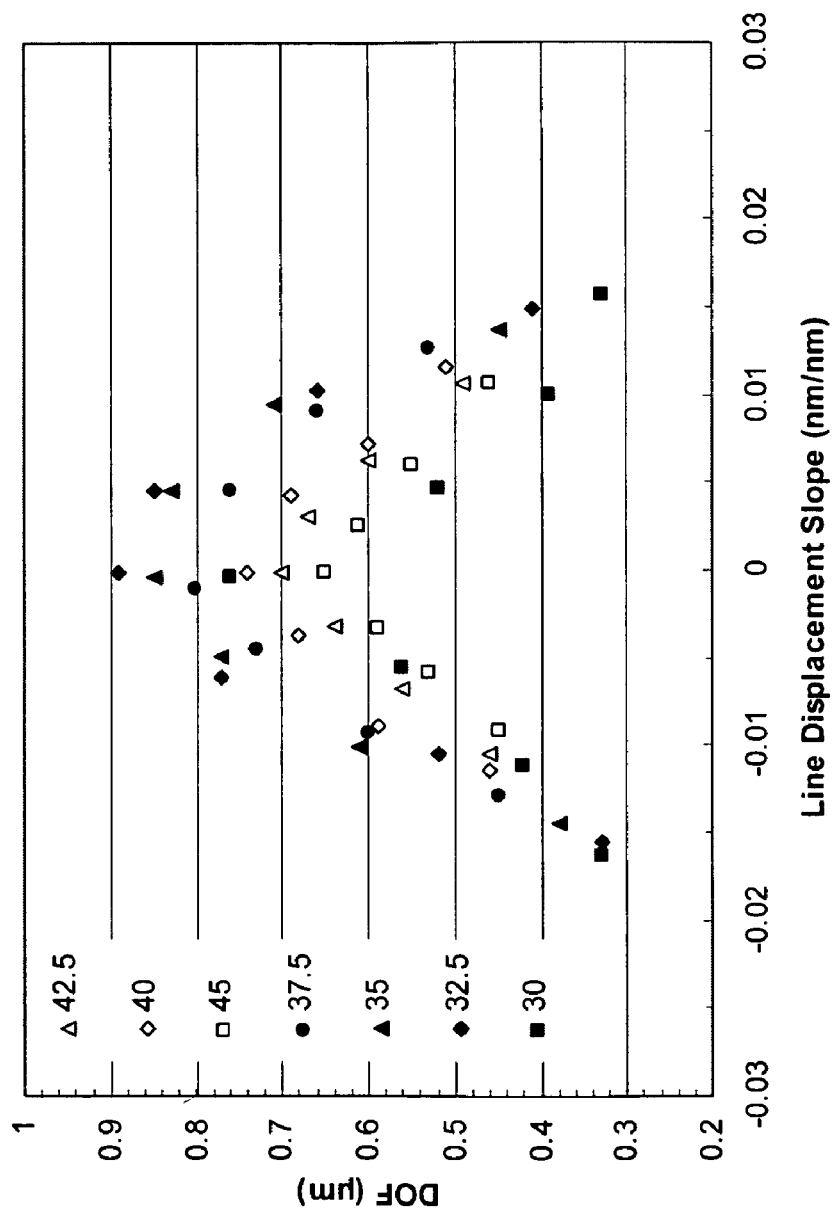

FIG. 12a and FIG. 12b illustrate the maximum allowed line displacement slope in order to obtain an allowable process window for different pitches. In other words, a relation between the depth of focus (DOF) at 8% exposure latitude and the line displacement slope is given for a 130 nm pitch and a 220 nm pitch respectively. Assuming that at least a depth of focus of 0.3 µm is required, the allowed line displacement slope at 130 nm pitch is 0.007 µm/µm, the allowed line displacement slope at 220 nm is 0.015 µm/µm and the allowed line displacement slope at 350 nm is 0.017 µm/µm. The latter may be used in combination with FIG. 10a to FIG. 10g to evaluate for which doses a specific etching depth can be used.

It is an advantage of embodiments of the present invention that lithographic processing can be obtained with a large process window for a wide range of pitches, i.e. including for the smallest pitches, allowing lithographic processing not suffering severely from image imbalance. The latter is obtained by taking into account the threshold, or taking into account the dose, in the image imbalance compensation optimisation.

It is an advantage of embodiments of the present invention that high quality lithographic processing is obtained for high numerical aperture or hyper numerical aperture applications.

It is to be understood that although preferred embodiments, specific constructions and configurations, as well as materials, have been discussed herein for devices, various changes or modifications in form and detail may be made without departing from the scope and spirit of this invention.

The invention claimed is:

1. A method of designing a phase shift mask, wherein the mask comprises at least a trench and light blocking parts, the mask being suitable for lithographic processing of a device using a predetermined illumination dose, the method comprising: selecting, by one or more computing devices, at least one set of mask parameters, the mask parameters comprising at least a trench bias, a light blocking part bias and an etching depth of the trench, taking into account the illumination dose, wherein the selecting at least one set of mask parameters comprises:
   selecting a plurality of sets of mask parameters suitable for using the phase shift mask substantially in focus, wherein the selecting a plurality of sets of mask parameters suitable for using the phase shift mask substantially in focus comprises adjusting the light blocking part bias to correct a feature size and adjusting the trench bias to correct a feature position; and
   selecting from the plurality of sets of mask parameters at least one set of mask parameters suitable for using the phase shift mask with the illumination dose in a predetermined out of focus range.

2. A method according to claim 1, wherein the selecting at least one set of mask parameters suitable for using the phase shift mask with the illumination dose in a predetermined out of focus range comprises selecting a set of mask parameters corresponding with a predetermined etching depth.

3. A method according to claim 1, wherein the selecting at least one set of mask parameters suitable for using the phase shift mask with the illumination dose in a predetermined out of focus range comprises:
   determining any of a focus-exposure matrix or an amount of feature displacement for a feature printable using the mask for the plurality of sets of mask parameters; and
   evaluating the focus exposure matrix or amount of feature displacement for a feature printable using the mask.

4. A method according to claim 3, the method further comprising: evaluating a focus-exposure window for a feature printable using the mask, wherein the focus-exposure window is determined by a common part of focus-exposure windows for at least two edges of the feature printable using the mask.

5. A method of designing a phase shift mask, the mask comprising at least a trench and light blocking parts, the mask being suitable for lithographic processing of a device using a predetermined illumination dose, the method comprises selecting, by one or more computing devices, a set of mask parameters comprising at least a trench bias, a light blocking part bias and an etching depth of the trench, taking into account the illumination dose, wherein the selecting a set of mask parameters comprises:
   selecting a plurality of sets of mask parameters suitable for using the phase shift mask substantially in focus, wherein the selecting a plurality of sets of mask parameters suitable for using the phase shift mask substantially in focus comprises adjusting the light blocking part bias to correct a feature size and adjusting the trench bias to correct a feature position; and
   selecting from the plurality of sets of mask parameters at least one set of mask parameters suitable for using the phase shift mask with the illumination dose in a predetermined out of focus range.

6. A method according to claim 5, wherein the selecting at least one set of mask parameters suitable for using the phase shift mask with the illumination dose in a predetermined out of focus range comprises selecting a set of mask parameters corresponding with a predetermined etching depth.

7. A method according to claim 5, wherein the selecting at least one set of mask parameters suitable for using the phase shift mask with the illumination dose in a predetermined out of focus range comprises:
   determining any of a focus-exposure matrix or an amount of feature displacement for a feature printable using the mask for the plurality of sets of mask parameters; and
   evaluating the focus exposure matrix or amount of feature displacement for a feature printable using the mask.

8. A method according to claim 7, wherein the method further comprises evaluating a focus-exposure window for a feature printable using the mask, wherein the focus-exposure window is determined by a common part of focus-exposure windows for at least two edges of the feature printable using the mask.

9. A computer-readable medium having stored thereon instructions which, when executed on a computing device, causes the computing device to perform the method of claim 5.

* * * * *